United States Patent
Nakatsu et al.

(10) Patent No.: US 7,329,475 B2
(45) Date of Patent: Feb. 12, 2008

(54) METHOD OF SELECTING PHOTOMASK BLANK SUBSTRATES

(75) Inventors: Masayuki Nakatsu, Niigata-ken (JP);
Tsuneo Numanami, Niigata-ken (JP);
Masayuki Mogi, Niigata-ken (JP);
Masamitsu Itoh, Yokohama (JP);
Tsuneyuki Hagiwara, Tokyo (JP);
Naoto Kondo, Tokyo (JP)

(73) Assignees: Shin-Estu Chemical Co., Ltd., Tokyo (JP); Kabushiki Kaisha Toshiba, Tokyo (JP); Nikon Corporation, Tokyo (JP)

( * ) Notice: Subject to any disclaimer, the term of this patent is extended or adjusted under 35 U.S.C. 154(b) by 724 days.

(21) Appl. No.: 10/896,968

(22) Filed: Jul. 23, 2004

(65) Prior Publication Data

US 2005/0019676 A1     Jan. 27, 2005

(30) Foreign Application Priority Data

Jul. 25, 2003    (JP) .............................. 2003-280463

(51) Int. Cl.
*G03F 1/00* (2006.01)
(52) U.S. Cl. ........................................... 430/5
(58) Field of Classification Search ............... 430/5, 430/394; 428/428, 430
See application file for complete search history.

(56) References Cited

U.S. PATENT DOCUMENTS

| | | | |
|---|---|---|---|
| 6,537,844 B1 | 3/2003 | Itoh | |
| 2003/0153114 A1* | 8/2003 | Itoh | ............................ 438/48 |
| 2004/0100624 A1 | 5/2004 | Hagiwara et al. | |
| 2005/0019677 A1 | 1/2005 | Nakatsu et al. | |
| 2005/0019678 A1 | 1/2005 | Nakatsu et al. | |
| 2005/0020083 A1 | 1/2005 | Numanami et al. | |

FOREIGN PATENT DOCUMENTS

JP    2003-050458 A    2/2003

* cited by examiner

*Primary Examiner*—S. Rosasco
(74) *Attorney, Agent, or Firm*—Birch, Stewart, Kolasch, Birch, LLP

(57) ABSTRACT

Provided that a pair of strip-like regions extend from 2 mm to 10 mm inside each of a pair of opposing sides along an outer periphery of a top surface of a substrate on which a mask pattern is to be formed, with a 2 mm edge portion excluded at each end in a lengthwise direction thereof, the height from a least squares plane for the strip-like regions on the substrate top surface to the strip-like regions is measured at intervals of 0.05-0.35 mm in horizontal and vertical directions, and a substrate in which the difference between the maximum and minimum values for the height among all the measurement points is νοτ μορε τηαν 0.5 μm is selected.

2 Claims, 4 Drawing Sheets

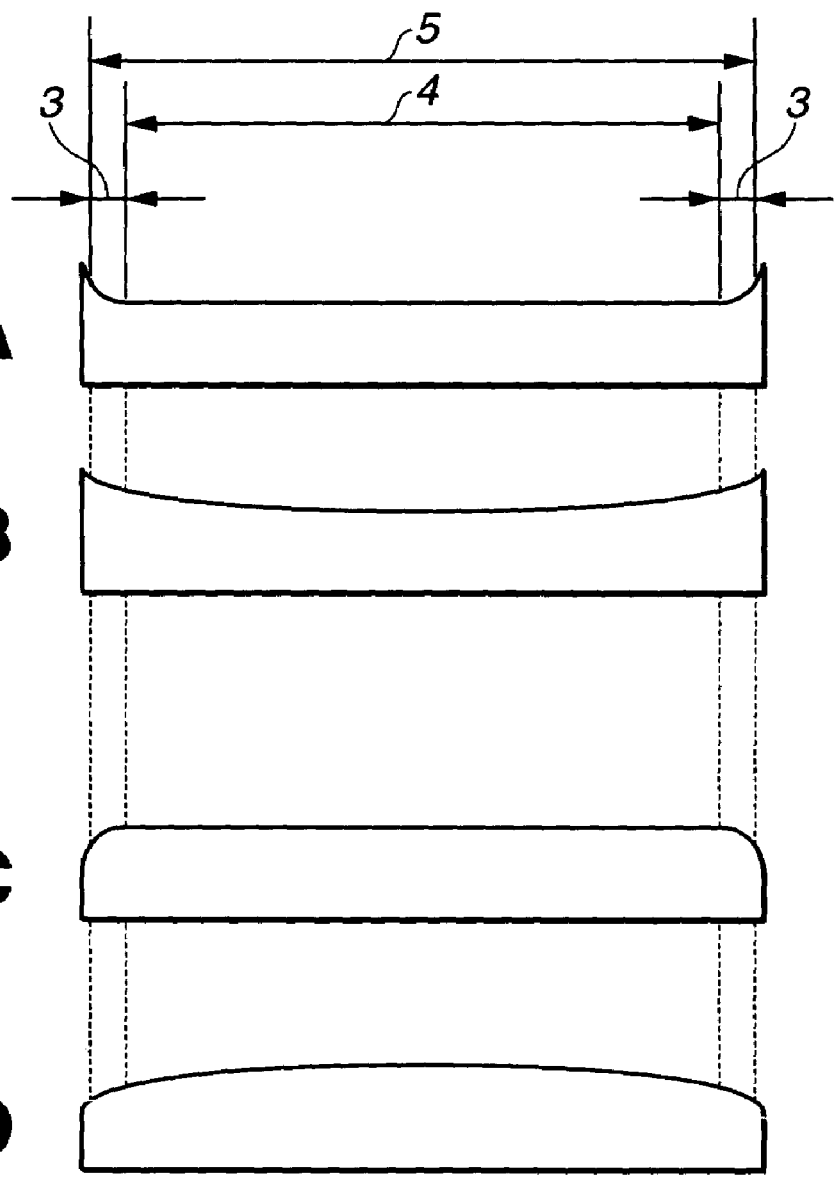

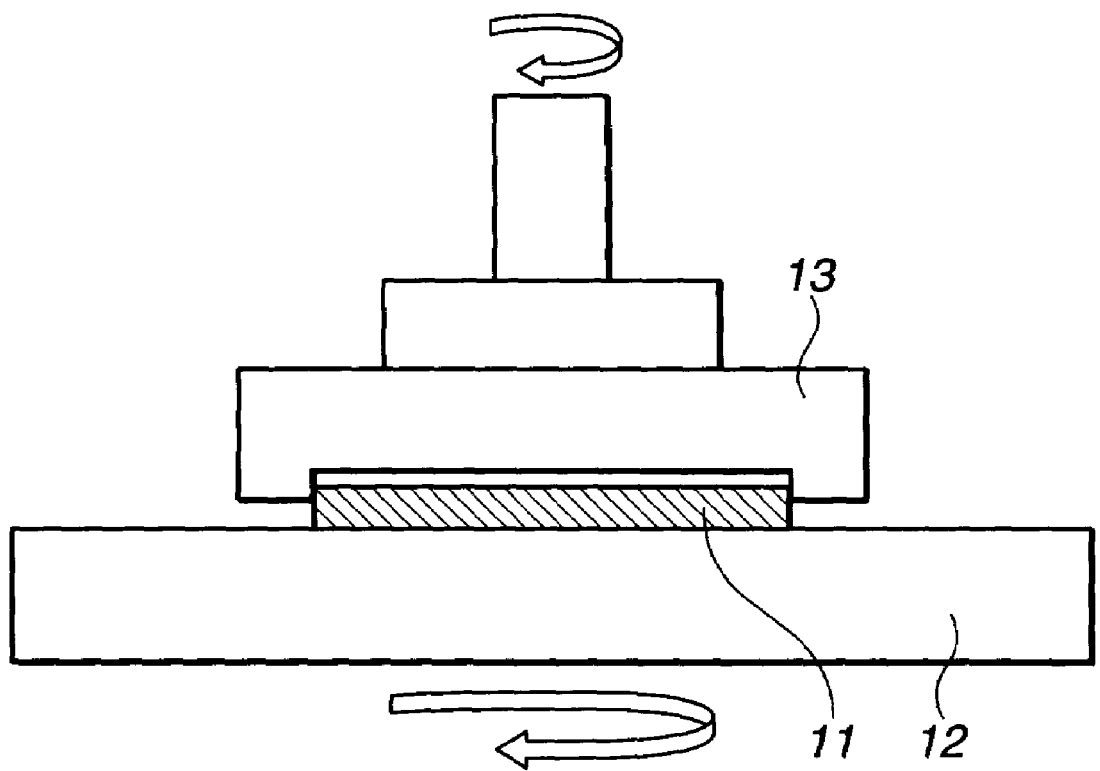

US 7,329,475 B2

METHOD OF SELECTING PHOTOMASK BLANK SUBSTRATES

CROSS-REFERENCE TO RELATED APPLICATION

This Non provisional application claims priority under 35 U.S.C. § 119(a) on Patent Application No. 2003-280463 filed in Japan on Jul. 25, 2003, the entire contents of which are hereby incorporated by reference.

BACKGROUND OF THE INVENTION

1. Field of the Invention

The present invention relates to a method of selecting substrates for photomask blanks from which photomasks can be fabricated for use in photolithography associated with the manufacture of such products as semiconductor devices.

2. Prior Art

As semiconductor devices continue to become more highly integrated, there is a growing desire for smaller geometries in photolithography. Already, the design rule for devices has been lowered to 0.11 µm and patterns are required to be accurate to 10 nm or less. These trends have led to a number of technical challenges concerning the accuracy of photolithographic processes employed in semiconductor manufacturing.

One such challenge relates to the flatness of the photomask used in lithography. Photomask flatness is an important factor for achieving higher accuracy in the patterning step. As the minimum feature size becomes smaller, the focal depth allowed by the resist becomes smaller, making it impossible to disregard the flatness of the substrate as a cause of focal shift.

To reduce focal shift in lithography, the mask pattern serving as the original must be accurately positioned to a degree where the exposure pattern can be written at a predetermined position and linewidth within the allowable error during wafer exposure. Hence, a deposited film, such as a patterned masking film or phase shift film, should ideally be formed on a substrate of exceptionally good flatness. However, when a photomask is mounted in a wafer exposure system, holding the photomask on the mask stage of the exposure system with a vacuum chuck in the manner disclosed in JP-A 2003-50458 can greatly deform the overall surface shape of the photomask, depending on the surface shape of the chucked portion of the photomask.

The photomask is generally fabricated by depositing on a transparent substrate a film such as a masking film, a semi-transparent film or a phase shift film, or a combination thereof, to produce a photomask blank. A resist is then applied onto the photomask blank to form a resist film, which is lithographically processed. Using the processed resist film as the etching mask, a mask pattern is formed. The resist film is finally stripped off.

A photomask is thus obtained after passing through a long series of operations. The transparent substrate used as the starting material in this process is prepared by cutting a slice from an ingot of synthetic quartz, and polishing the surfaces of the slice. Until now, this surface polishing operation has been carried out only with the intention of reducing surface defects or minimizing warpage of the substrate surface so as to provide a flat surface. Therefore, nothing has previously been known about how to modify the surface shape of the photomask substrate to achieve an even smaller minimum feature size in a pattern written on a wafer substrate; that is, specifically what shape the surface of the photomask should be given where it will be held with a vacuum chuck, based on the shape the photomask assumes when held by the vacuum chuck. Nor has anything been known about what sort of method may be used to form such a surface shape so as to enable the production of substrates having the desired surface shape in a good yield or about how to suppress the formation of defects on the substrate itself or of photomask defects that originate from the substrate.

SUMMARY OF THE INVENTION

It is therefore one object of the invention to provide a method of selecting photomask blank substrates capable of giving photomasks which can be used to expose patterns having a reduced minimum feature size to a high accuracy on a wafer substrate.

The inventor has discovered a method of selecting photomask blank substrates which are quadrangular and have a length on each side of at least 6 inches. Provided that a pair of strip-like regions extend from 2 mm to 10 mm inside each of a pair of opposing sides along an outer periphery of a top surface of a substrate on which a mask pattern is to be formed, with a 2 mm edge portion excluded at each end in a lengthwise direction thereof, the height from a least squares plane for the strip-like regions on the substrate top surface to the strip-like regions is measured at intervals of 0.05 to 0.35 mm in horizontal and vertical directions, and a substrate in which the difference between the maximum and minimum values for the height among all the measurement points is not more than 0.5 µm is selected as a substrate having an acceptable surface shape. Alternatively, provided that a quadrangular ring-shaped region extends from 2 mm to 10 mm within each side along an outer periphery on a top surface of a substrate on which a mask pattern is to be formed, the height from a least squares plane for the quadrangular ring-shaped region on the substrate top surface to the quadrangular ring-shaped region is measured at intervals of 0.05 to 0.35 mm in horizontal and vertical directions, and a substrate in which the difference between the maximum and minimum values for the height among all the measurement points is not more than 0.5 µm is selected as a substrate having an acceptable surface shape. By using the selected substrates to produce photomask blanks, then processing the blanks into photomasks, the photomasks are given a good patterned surface shape during use at the time of wafer exposure. By holding the resulting photomasks on the mask stage of a wafer exposure system with a vacuum chuck or the like, the patterned surface is placed in a highly flat state having minimal warp, making it possible to accurately align the mask pattern at a predetermined position, and in turn enabling very fine exposure patterns to be written onto wafers to good position and linewidth accuracies. Such photomasks can be produced in high yields.

The above method of selecting photomask blank substrates means that those substrates that will afford a good patterned surface shape during use at the time of wafer exposure can be efficiently selected in their manufacture stage. Differently stated, those substrates that will afford a wrong patterned surface shape during use as a photomask and thus fail to provide a desired pattern exposure precision can be rejected or removed through efficient selection at the substrate manufacture stage. This minimizes a possibility for a photomask to suffer from defects due to configurational defects on the patterning surface of the substrate.

In one aspect, the invention provides a method of selecting photomask blank substrates which are quadrangular and have a length on each side of at least 6 inches, provided that a pair of strip-like regions extend from 2 mm to 10 mm inside each of a pair of opposing sides along an outer periphery of a top surface of a substrate on which a mask pattern is to be formed, with a 2 mm edge portion excluded at each end in a lengthwise direction thereof, the method comprising the steps of measuring the height from a least squares plane for the strip-like regions on the substrate top surface to the strip-like regions at intervals of 0.05 to 0.35 mm in horizontal and vertical directions, and selecting, as a substrate having an acceptable surface shape, a substrate in which the difference between the maximum and minimum values for the height among all the measurement points is not more than 0.5 µm.

In another aspect, the invention provides a method of selecting photomask blank substrates which are quadrangular and have a length on each side of at least 6 inches, provided that a quadrangular ring-shaped region extends from 2 mm to 10 mm within each side along an outer periphery on a top surface of a substrate on which a mask pattern is to be formed, the method comprising the steps of measuring the height from a least squares plane for the quadrangular ring-shaped region on the substrate top surface to the quadrangular ring-shaped region at intervals of 0.05 to 0.35 mm in horizontal and vertical directions, and selecting, as a substrate having an acceptable surface shape, a substrate in which the difference between the maximum and minimum values for the height among all the measurement points is not more than 0.5 µm.

The substrate selected by the inventive method ensures that a photomask produced therefrom provides a fully flat surface shape during use or at the time of wafer exposure. In using such a substrate to produce a photomask blanks, then processing the blank into a photomask and holding the resulting photomask on the mask stage of a wafer exposure system with a vacuum chuck or the like, the substrate surface is in a highly flat state having minimal warp, making it possible to accurately align the mask pattern at a predetermined position, and in turn enabling very fine exposure patterns to be written onto wafers to good position and linewidth accuracies. This fully complies with the requirement of reducing the pattern feature size in the photolithography.

Those substrates that will afford a good surface shape at the time of wafer exposure can be efficiently selected at their manufacture stage. Differently stated, those substrates that will afford a wrong surface shape during use as a photomask and thus fail to provide a desired pattern exposure precision can be rejected or removed through efficient selection at the substrate manufacture stage. A possibility for a photomask to suffer from defects arising from a wrongly configured surface shape of the original substrate can be minimized at the substrate stage, with the benefit of increased productivity of photomasks.

BRIEF DESCRIPTION OF THE DIAGRAMS

FIG. 3 shows sectional views of some examples of top surface shapes on substrates.

FIG. 4 is a schematic cross-sectional view of a single side polishing machine such as may be used to produce substrates of an acceptable surface shape that are selected by the method of the invention.

DETAILED DESCRIPTION OF THE INVENTION

The method of selecting photomask blank substrates according to the first aspect of the invention relates to photomask blank substrates of quadrangular shape with one side having a length of at least 6 inches. Each substrate has a top surface on which a mask pattern is to be formed. A pair of strip-like regions extend from 2 mm to 10 mm inside each of a pair of opposing sides along an outer periphery of the substrate top surface, with a 2 mm edge portion excluded at each end in a lengthwise direction thereof. According to the inventive method, the height from a least squares plane for the strip-like regions on the substrate top surface to the strip-like regions is measured at intervals of 0.05 to 0.35 mm in horizontal and vertical directions. A substrate in which the difference between the maximum and minimum values for the height among all the measurement points is not more than 0.5 µm is selected as a substrate having an acceptable surface shape.

Figure 1A:
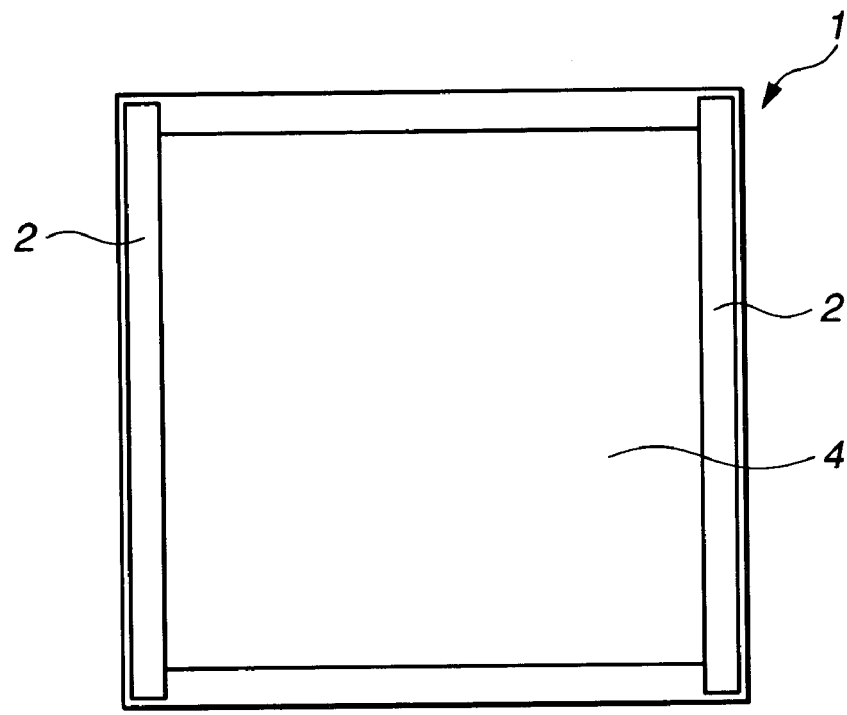
FIG. 1 shows strip-like regions, a quadrangular ring-shaped region and patterning regions on the top surfaces of substrates.

The term "strip-like region" as used herein is explained below while referring to FIG. 1A, which shows the substrate top surface 1 on which a suitable film such as a film having light-shielding properties, or a film pattern thereof, is formed when a substrate is rendered into a photomask blank or a photomask. In the diagram, a pair of strip-like regions 2 extend from 2 mm to 10 mm inside each of a pair of opposing sides along an outer periphery of the top surface 1, but exclude at each end in a lengthwise direction thereof a 2 mm edge portion. These strip-like regions have a shape and height characterized by the shape and values described above. The film pattern (mask pattern) is formed in a patterning region 4 which is situated between the strip-like regions 2 and begins 10 mm inside the respective sides making up the outer periphery of the top surface. When a photomask is fabricated using such a substrate and the photomask is held, near a pair of opposing sides, on the mask stage of a wafer exposure system with a vacuum chuck, the vacuum chucking positions are included within these strip-like regions. Hence, the shape of these strip-like regions governs the shape of the entire top surface of the substrate during wafer exposure; i.e., the shape of the entire top surface of the substrate on which the mask pattern is formed. That is, accurate exposure of the pattern with respect to position and linewidth requires that the substrate top surface, and in particular the patterning region, have a shape which can, at the time of pattern exposure, be disposed parallel to the exposure light without tilting the mask pattern. Accordingly, it is possible, using the inventive selection method, to optimize as described above the shape and height of the strip-like regions which primarily govern the shape of the entire top surface of the substrate, and especially the shape of the patterning region.

In this embodiment, the strip-like regions extend from 2 to 10 mm inside each of a pair of opposing sides along the outer periphery of the top surface of the substrate but exclude at each end in a lengthwise direction thereof a 2 mm edge portion. If the strip-like regions satisfy the particular shape and value ranges mentioned above, they will satisfy the above-described shape and value ranges at the vacuum chucking positions (substrate holding positions) as well, enabling flatness to be achieved at the time of photomask use. Alternatively, it is acceptable for the above-described shape and values to be satisfied at least at the vacuum chucking positions or the substrate holding positions.

It is desirable for each strip-like region as a whole to have a shape which is inclined downward toward the outer periphery of the substrate. However, the patterning region situated between the strip-like regions is not subject to any particular limitation, and may have various shapes, such as a planar shape, convex shape or concave shape.

The difference between the maximum and minimum values for height from the least squares plane for the strip-like regions on the substrate top surface to the strip-like regions is preferably not more than 0.5 µm, and more preferably not more than 0.3 µm.

Figure 2A:
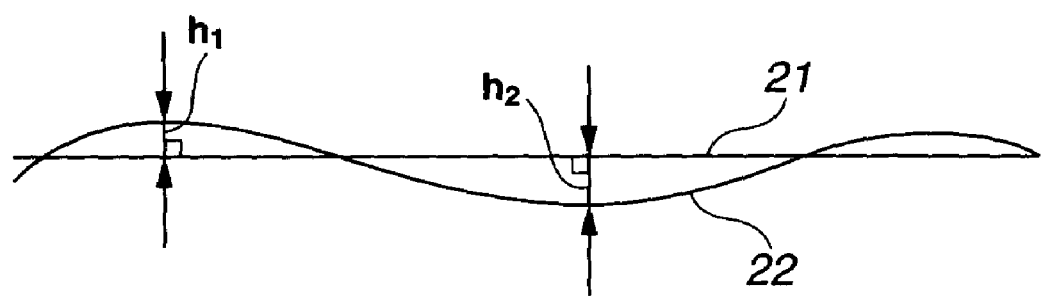
FIG. 2 shows sectional views illustrating the concepts of a least squares plane for a surface and of a height from such a least squares plane.
Figure 2B:
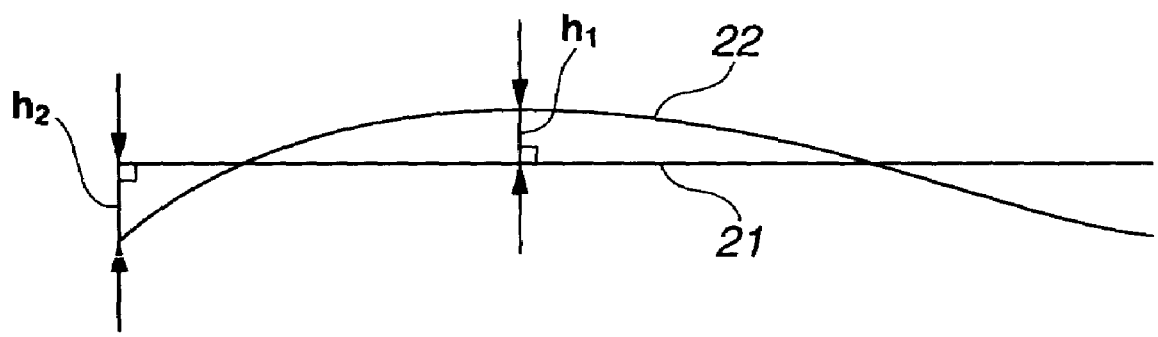

As illustrated in FIGS. 2A and 2B, the least squares plane 21 refers herein to an imaginary plane obtained by using the method of least squares to arithmetically approximate as a flat plane a non-horizontal surface 22 such as a concave surface, convex surface or a surface having convex and concave areas. In the present invention, the height of each region is given with respect to the least squares plane for that respective region on the top surface of the substrate. However, for the sake of convenience, the least squares plane for the entire subsequently described principal surface region may be used as the reference plane for each respective region. The height from this least squares plane 21 to the non-horizontal surface 22 is the height taken perpendicular to this least squares plane 21. In FIG. 2, $h_1$ represents the maximum value for height and is a positive number lying above the least squares plane 21, $h_2$ is the minimum value for height and is a negative number lying below the least squares plane 21. The difference between the maximum and minimum values $h_1$ and $h_2$ is thus the same as the sum of the respective absolute values for $h_1$ and $h_2$.

No particular limitation is imposed on the patterning region, although the difference between the maximum and minimum values for height from the patterning region least squares plane to the patterning region is preferably not more than 0.5 µm, more preferably not more than 0.3 µm, and most preferably not more than 0.2 µm.

The method of selecting photomask blank substrates according to the second aspect of the invention relates to photomask blank substrates of quadrangular shape with one side having a length of at least 6 inches. Each substrate has a top surface on which a mask pattern is to be formed. A quadrangular ring-shaped region extends from 2 mm to 10 mm inside the respective sides defining an outer periphery on the substrate top surface. According to the inventive method, the height from a least squares plane for the quadrangular ring-shaped region on the substrate top surface to the quadrangular ring-shaped region is measured at intervals of 0.05 to 0.35 mm in horizontal and vertical directions. A substrate in which the difference between the maximum and minimum values for the height among all the measurement points is not more than 0.5 µm is selected as a substrate having an acceptable surface shape.

Figure 1B:
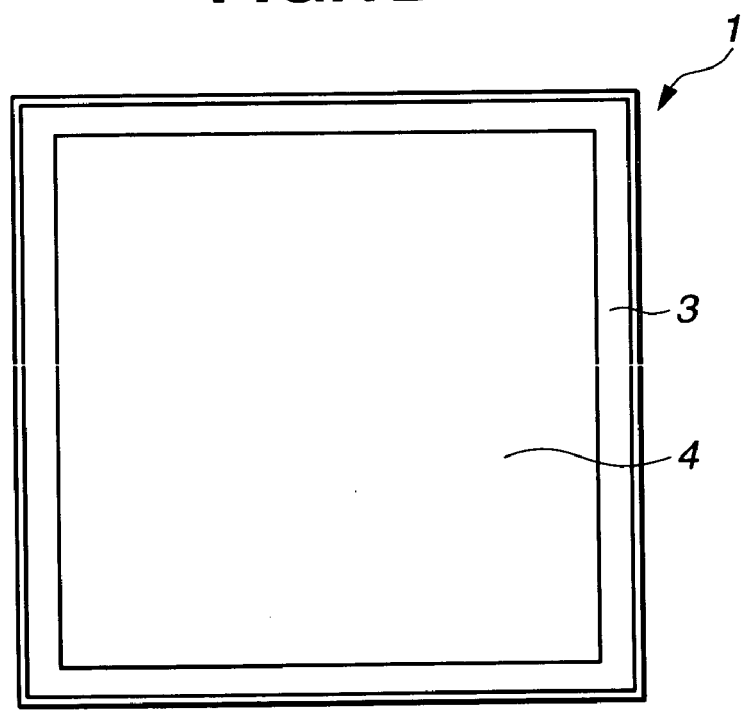

The term "quadrangular ring-shaped region" as used herein is explained below while referring to FIG. 1B, which shows the substrate top surface 1 on which a suitable film such as a film having light-shielding properties, or a film pattern thereof, is formed when a substrate is rendered into a photomask blank or a photomask. In the diagram, a quadrangular ring-shaped region 3 extends from 2 mm to 10 mm inside the respective sides making up the outer periphery of the top surface. The quadrangular ring-shaped region 3 has a shape and height characterized by the shape and values described above. The film pattern (mask pattern) is formed in a patterning region 4 which is situated within the inner periphery of the quadrangular ring-shaped region 3 and begins 10 mm inside the respective sides making up the outer periphery of the top surface. When this substrate is used to fabricate a photomask and the resulting photomask is held on the mask stage of a wafer exposure system with a vacuum chuck or the like near the outer periphery of the substrate along its entire perimeter, or near only a pair of opposing sides, with the horizontal and vertical sides of the substrate being interchangeable, the vacuum chucking positions are included within this quadrangular ring-shaped region. Hence, the shape of the quadrangular ring-shaped region governs the shape of the entire top surface of the substrate during wafer exposure; i.e., the shape of the entire top surface of the substrate on which the mask pattern is formed. That is, accurate exposure of the pattern with respect to position and linewidth requires that the top surface of the substrate, and in particular the patterning region, have a shape which can, at the time of pattern exposure, be disposed parallel to the exposure light without tilting the mask pattern. Accordingly, it is possible, using the inventive selection method, to optimize as described above the shape and height of the quadrangular ring-shaped region which primarily governs the shape of the entire top surface of the substrate, and especially the shape of the patterning region.

Here, the quadrangular ring-shaped region extends from 2 mm to 10 mm inside the respective sides making up the outer periphery of the top surface. If the quadrangular ring-shaped region satisfies the particular shape and value ranges mentioned above, it will satisfy these shape and value ranges at the vacuum chucking positions as well, enabling flatness to be achieved at the time of photomask use. Alternatively, it is acceptable for the above-described shape and values to be satisfied at least at the vacuum chucking positions or the substrate holding positions.

It is desirable for this quadrangular ring-shaped region as a whole to have a shape which is inclined downward toward the substrate periphery. However, the patterning region situated inside the quadrangular ring-shaped region is not subject to any particular limitation, and may have various shapes, such as a planar shape, convex shape or concave shape.

The difference between the maximum and minimum values for height from the least squares plane for the quadrangular ring-shaped region to the quadrangular ring-shaped region is preferably not more than 0.5 µm, and more preferably not more than 0.3 µm.

The patterning region is not subject to any particular limitation, although it is desirable for the difference between the maximum and minimum values for the height from the patterning region least squares plane to the patterning region to be not more than 0.5 µm, preferably not more than 0.3 µm, and more preferably not more than 0.2 µm.

In the photomask blank substrate selected by the method of the invention, it is moreover desirable for the difference between the maximum and minimum values for height from the least squares plane for a principal surface region, which consists of the quadrangular ring-shaped region and the patterning region situated inside the inner periphery of this quadrangular ring-shaped region, to the principal surface region itself to be not more than 0.5 µm, and especially not more than 0.3 µm.

The shapes of these strip-like regions, quadrangular ring-shaped regions and patterning regions on the top surface of the substrate, and their heights relative to a least squares plane, can be measured and analyzed using a device such as a flatness tester.

Thorough shape and height measurements of the strip-like regions or the quadrangular ring-shaped region are required to obtain the desired shape. Up until now, when fabricating a mask, measurements concerned particularly with substrate warpage have been carried out on the area where the pattern is to be formed. However, because adequate measurements have not been carried out on the strip-like regions or quadrangular ring-shaped region which include the chucking area, it has been impossible to predict the change in shape of the substrate after chucking. Therefore, when measuring the strip-like regions or quadrangular ring-shaped region on the top surface of the substrate in order to predict the change in shape after chucking, it is advantageous for these measurements to be carried out under the following conditions.

(1) Areas where substrate shape is measured: The above-described strip-like regions or quadrangular ring-shaped region are measured together with positional information. Inadequate positional information may make it impossible to accurately predict the shape.
(2) Measurement interval: 0.05 to 0.35 mm. A measurement interval that is too broad may make it impossible to achieve a sufficiently good prediction of the shape. On the other hand, too narrow a measurement interval may render measurement excessively cumbersome.
(3) Measurement accuracy (error): 0.01 to 0.1 µm. A measurement error that is too large may make it impossible to achieve a sufficiently good prediction of the shape. On the other hand, a measurement error that is too small may render measurement excessively cumbersome and result in a poor efficiency.

Measurement involves the use of light interference. Because the shape and height of the surface are determined based on a reference plane for the surface, this reference plane must have a sufficient degree of accuracy (e.g., an error of not more than 0.02 µm, preferably not more than 0.01 µm).

The photomask blank substrate selected by the method of the invention may be made of a suitable material such as synthetic quartz. It is typically a quadrangular, and preferably square, substrate having a length on one side which is at least 6 inches (at least 152 mm), and is preferably 6 inches (152 mm). The substrate has a maximum size which, although not subject to any particular limitation, is preferably not more than 12 inches for reasons having to do with the weight of the substrate during wafer exposure and its handleability. The substrate has a thickness which, while not subject to any particular limitation, is preferably from 3 to 10 mm.

Marks for verifying the orientation of the substrate are sometimes formed on the substrate. Marks of this type are generally placed on the back (bottom surface) of the substrate. However, in cases where such marks are placed on the top surface, the area of the marks shall be excluded from substrate shape considerations according to the invention.

By using photomask blank substrates with strip-like regions or a quadrangular ring-shaped region of the above shape to produce photomask blanks, and using the resulting photomask blanks to fabricate photomasks, it is possible to manufacture in a good yield masks which undergo little patterning region deformation when chucked in a wafer exposure system.

Such photomask blank substrates may be produced by a method such as the following.

First, a starting substrate is subjected to an initial polishing step so as to give it a specific intermediate shape, after which a final polishing step is carried out. If the substrates do not pass through a stage in which they have a desirable intermediate shape, it will be difficult to obtain substrates of a desirable final shape in a good yield.

Here, depending on the combination of polishing techniques employed, two different types of desirable intermediates may be obtained, and so two processes may be used. In one process, referred to below as Production Method 1, the substrate is polished under conditions that rapidly remove material from the center of the substrate, then is polished under conditions that rapidly remove material from the periphery of the substrate. In the other process, referred to below as Production Method 2, the substrate is polished under conditions that rapidly remove material from the periphery of the substrate, then is polished under conditions that rapidly remove material from the center of the substrate.

In this substrate production process, initial polishing is a double side polishing operation. The polishing machine used in this operation may be a double side polishing machine of a type that already exists. Such a machine uses a lower plate and an upper plate to polish both sides of the starting substrate at the same time. In the prior art, polishing has not been carried out in order to control the shape of the substrate, particularly the shape and height of the above-described strip-like regions or quadrangular ring-shaped region, and so this stage of polishing has not been subjected to any particular control. As a result, there has been substantial variation in the surface shape of the strip-like regions or the quadrangular ring-shaped region on the top surface of the resulting substrate.

By contrast, when a substrate is produced using the present method, polishing is carried out under conditions that rapidly remove material from the center of the substrate in the case of Production Method 1, and under conditions that rapidly remove material from the periphery of the substrate in the case of Production Method 2. Specifically, it is preferable to carry out polishing at a speed of about 1 to 200 rpm. In the resulting polished intermediate product, the shape and height of the quadrangular ring-shaped region or the patterning region on the intermediate polished product can be measured and analyzed by a method (i.e., apparatus and measurement conditions) like that described above.

Production Methods 1 and 2 are each described below.

[Production Method 1]

First, a polished intermediate product in which the substrate top surface (polished side) satisfies the conditions for intermediate shapes 1 and 2 below is prepared in initial polishing. The polished intermediate product is then final polished under different polishing conditions, thereby giving a substrate having a specific shape.

(Intermediate Shape 1)

This is a shape in which the difference between the maximum and minimum values for height from the principal surface-region least squares plane to the principal surface region is not more than 1.5 µm, and preferably not more than 1.0 µm, and in which the quadrangular ring-shaped region is inclined upward toward the outer periphery of the substrate.

(Intermediate Shape 2)

This is a shape in which the difference between the minimum and maximum values for height from the principal surface-region least squares plane to the principal surface region is not more than 1.5 µm, and preferably not more than 1.0 µm; the difference between the maximum and minimum values for height from the principal surface-region least squares plane to the four corners (vertices) of the principal surface region (which difference is sometimes abbreviated herein as "CIR") is not more than 0.5 µm, and preferably not more than 0.3 µm; and the quadrangular ring-shaped region is inclined upward toward the outer periphery of the substrate.

Examples of substrate top surface shapes in which the quadrangular ring-shaped region is inclined upward toward the substrate periphery include shapes where, as shown in FIG. 3A, the patterning region at the center of the substrate top surface is planar and the quadrangular ring-shaped region 3 that is continuous from the outer periphery of the patterning region 4 is inclined so as to curve upward; and shapes which, as shown in FIG. 3B, have a concave surface that extends from the patterning region 4 to the quadrangular ring-shaped region 3 (i.e., shapes in which the principal surface region forms a concave surface). In FIG. 3, the numeral 5 designates the principal surface region.

The polished intermediate product having such an intermediate shape is then additionally polished, which operation can be carried out using a single side polishing machine like that shown in FIG. 4. FIG. 4 shows a substrate 11, a lower plate 12 and a top ring 13. In Production Method 1, the specific shape of the invention can be more effectively formed by holding the polished intermediate product in the single side polishing machine and polishing the side of the product on which a mask pattern is to be formed, with a reduced pressure acting on the side of the substrate opposite from the polished side. Moreover, in the polishing machine, a flat plate may be used as the bottom plate, although polishing with a convex plate enables a substrate of a better shape to be obtained. The outer periphery of the quadrangular ring-shaped region on the top surface of the substrate is generally chamfered on the outside.

[Production Method 2]

First, a polished intermediate product in which the substrate top surface (polished side) satisfies the conditions for intermediate shapes 3 and 4 below is prepared by initial polishing. The polished intermediate product is then final polished under different polishing conditions, thereby giving a substrate having a specific shape.

(Intermediate Shape 3)

This is a shape in which the difference between the maximum and minimum values for height from the principal surface-region least squares plane to the principal surface region is not more than 1.5 µm, and preferably not more than 1.0 µm, and in which the quadrangular ring-shaped region is inclined downward toward the outer periphery of the substrate.

(Intermediate Shape 4)

This is a shape in which the difference between the minimum and maximum values for the height from the principal surface-region least squares plane to the principal surface region is not more than 1.5 µm, and preferably not more than 1.0 µm; the difference between the maximum and minimum values for height from the principal surface-region least squares plane to the four corners (vertices) of the principal surface region (CIR) is not more than 0.5 µm, and preferably not more than 0.3 µm; and the quadrangular ring-shaped region is inclined downward toward the outer periphery of the substrate.

Examples of substrate top surface shapes in which the quadrangular ring-shaped region is inclined downward toward the substrate periphery include shapes where, as shown in FIG. 3C, the patterning region at the center of the substrate top surface is planar and the quadrangular ring-shaped region that is continuous from the outer periphery of the patterning region is inclined so as to curve downward; and shapes which, as shown in FIG. 3D, have a convex surface that extends from the patterning region to the quadrangular ring-shaped region (i.e., shapes in which the principal surface region forms a convex surface).

In Production Method 2, the specific shape of the invention can be more effectively formed by holding the polished intermediate product in a single side polishing machine like that shown in FIG. 4 and polishing the side of the product on which a mask pattern is to be formed, with a pressure applied to the side of the substrate opposite from the polished side. Moreover, in the polishing machine, a flat plate may be used as the bottom plate, although polishing with a convex plate enables a substrate of a better shape to be obtained.

By polishing in two stages that pass through operations like those described above, substrates having a specific shape at given places on the top surface of the substrate can be produced in a good yield. The outer periphery of the quadrangular ring-shaped region on the top surface of the substrate is generally chamfered on the outside.

In the patterning region of the polished intermediate product, it is desirable for the difference between the maximum and minimum values for the height from the patterning region least squares plane to the patterning region to be not more than 0.5 µm, preferably not more than 0.3 µm, and most preferably not more than 0.2 µm. Moreover, the patterning region may have any suitable shape, including a planar shape, convex shape or concave shape.

A film having light shielding properties, such as a masking film or a phase shift film, is suitably selected according to the intended use of the photomask, and is formed on the resulting substrate to give a photomask blank. Masking films and phase shift films such as halftone phase shift films are generally formed by a sputtering process. In this invention, "a film having light shielding properties" includes films which substantially block the passage of exposure light, such as halftone phase shift film.

In the production of a photomask blank for a binary mask, a layer of a suitable material is deposited as the masking film on the substrate selected by the method of the invention. Examples of materials suitable for this purpose include metallic chromium; chromium compounds such as chromium oxide, chromium nitride, chromium oxide nitride and chromium oxide nitride carbide; and metal silicide compounds such as molybdenum silicide, titanium silicide and zirconium silicide, as well as oxides, nitrides, oxide nitrides and oxide nitride carbides thereof. This masking film is generally formed by using two or more layers of materials having different refractive indices, or by using a material within which the components have been provided with a composition gradient, so as to confer an anti-reflection capability. It is preferable for the stress in these films to be low.

In the production of a phase shift mask blank for a halftone phase shift mask, the substrate produced by the inventive method has formed thereon a halftone phase shift film which attenuates exposure light to a degree where the light substantially does not sensitize the photoresist, and which also has the ability to shift the phase of the light 180°. Examples of such materials that may be used include chromium compounds such as chromium oxide, chromium nitride, chromium oxide nitride and chromium oxide nitride carbide; metal silicide compounds such as molybdenum silicide, titanium silicide and zirconium silicide, as well as oxides, nitrides, oxide nitrides and oxide nitride carbides thereof; and also silicon nitride and silicon oxide.

The halftone phase shift film may be a single-layer or multilayer film. However, to provide both resistance to post-patterning operations such as chemical washing and also good processability, it is preferable to use a multilayer film in which the materials or compositions on the surface side and on the substrate side differ, or a film having a composition gradient. As in the case of the masking film, it is preferable for the combination of materials making up the halftone phase shift film to be selected such as to minimize film stress.

In addition, the above-described masking film is generally formed on top of the halftone phase shift film. If exposure is repeated at different positions on a photoresist-coated wafer, the peripheral portion of the halftone phase shift mask where transmittance has been lowered to prevent sensitization may be subjected to overlapping exposure. As a result, the areas of overlap are exposed a plurality of times and may become sensitized, something which must be prevented from happening. To this end, it is generally desirable to deposit a masking film on the peripheral portion of the halftone phase shift mask where the mask pattern is not written. It is thus preferable, in terms of the overall order of the operations, for the masking film to be already formed at the stage of halftone phase shift mask blank production. Accordingly, to obtain this type of mask, the masking film is deposited together with the halftone phase shift film during production of the halftone phase shift mask blank. Moreover, a phase shift mask can be formed by depositing on the substrate a high-transmittance phase shift film, as is done in the case of Levenson type phase shift masks. If necessary, an electrically conductive film and an etching stopper film can be deposited over any of the above films.

The film deposited on the substrate selected by the method of the invention, while not subject to any particular limitations, has a film stress which, when expressed as the amount of film warp by the substrate, is preferably not more than 0.5 µm, more preferably not more than 0.3 µm, even more preferably not more than 0.2 µm, and most preferably not more than 0.1 µm. At a large film stress, substrate deformation may worsen depending on the extent of coverage by the film (patterning area) over the photomask, possibly preventing the desired flatness from being achieved.

When a film such as a masking film is formed on the substrate, stress by the film deforms the substrate. Because substrate deformation by such film stress primarily effects a change in the warp of the substrate, it alters the shape at the top surface of the substrate. Hence, when determining the shape of the substrate top surface, by predicting, at a substrate stage prior to deposition of the masking film, the stress of the film to be formed and the shape of the photomask when it is held by a chuck in a wafer exposure system, mask production can be carried out to an even better yield.

Film stress varies depending on the film type and composition, as well as the method of manufacture. For example, a chromium-based film causes tensile stress, whereas a MoSi-based film generates compressive stress. Deformation of the substrate top surface due to film stress can be determined by depositing a given film on a substrate whose top surface shape and height have already been measured, then measuring and analyzing the shape and height of the substrate top surface following film deposition. Therefore, through measurement of the amount of deformation before and after film deposition at various positions on the top surface of a substrate, preliminary measurement of stress and degree of deformation and, based on these measurements, simulation from the shape of the substrate on which no film has been formed, it is possible to predict the shape of the substrate following film deposition and to determine, on the basis of the predicted shape, the shape the photomask will have when it is clamped in the exposure tool. An even more accurate simulation is possible by also taking into account the film (patterned area) coverage on the substrate top surface when a mask pattern has been formed as the photomask. Hence, in a process where one or more layer, including at least a masking layer or a phase shift layer, is deposited on a top surface of a photomask blank substrate to form a photomask blank, the deposited layer is patterned to form a photomask, and the photomask is mounted in an exposure tool, by simulating a change in shape of the top surface of the substrate from prior to film deposition thereon to when the photomask is mounted in the exposure tool, determining the shape of the substrate top surface prior to the change that will impart to the top surface a flat shape when the photomask is mounted in the exposure tool, and selecting, as an acceptable substrate, a substrate having this top surface shape prior to deposition, the shape and height of the substrate top surface are varied in accordance with such considerations as the type of film to be deposited on the substrate and changes in the shape of the substrate top surface due to the film, making it possible to produce in a higher yield substrates which are capable of conferring a good flatness at the time of photomask use.

As described above, when a photomask fabricated using the substrate selected by the inventive method is chucked in a wafer exposure system, the substrate provides an excellent flatness. It is therefore possible to accurately align the mask pattern at a predetermined position, enabling an exposure pattern of small minimum feature size to be written on the wafer to high position and linewidth accuracies. Such a substrate fully meets the requirements for smaller pattern geometries in photolithography, and is especially preferred as a photomask blank substrate for the fabrication of photomasks used in the exposure of very fine patterns having a linewidth of 0.12 µm or less, and especially 0.10 µm or less.

EXAMPLES

The following examples are given by way of illustration and not by way of limitation.

Example 1

Using a flatness tester, the height of a principal surface region on 152 mm (6 inch) square photomask blank substrates was measured at intervals of 0.3 mm in horizontal and vertical directions and at an accuracy of 0.1 µm or less. Fifty (50) substrates were selected in which the difference between the maximum and minimum values for height from a least squares plane for the principal surface region to the principal surface region was equal to or less than 0.5 µm and the quadrangular ring-shaped region was inclined downward toward the outer periphery of the substrate.

By sputtering, a chromium film of 100 nm thick was deposited onto each selected substrate to form a photomask blank. A resist film was deposited onto the blank. The resist film was lithographically processed, and the processed resist film was used as an etching mask to form a mask pattern. The resist film was then stripped off, giving in each case a photomask with a line-and-space pattern that provides a 0.1 µm linewidth on wafers during exposure and that had a pattern coverage (percent covered by chromium) in the principal surface region of the substrate of 94%. When the resulting photomasks were vacuum chucked onto the mask stage in a wafer exposure system, 44 of the 50 photomasks had an acceptable flatness.

Comparative Example 1

Using a flatness tester, the height of a principal surface region on 152 mm (6 inch) square photomask blank substrates was measured at intervals of 0.8 mm in horizontal and vertical directions and at an accuracy of 0.1 µm or less. Fifty (50) substrates were selected in which the difference between the maximum and minimum values for height from a least squares plane for the principal surface region to the principal surface region was equal to or less than 0.5 µm and the quadrangular ring-shaped region was inclined downward toward the outer periphery of the substrate.

By sputtering, a chromium film of 100 nm thick was deposited onto each selected substrate to form a photomask blank. A resist film was deposited onto the blank. The resist film was lithographically processed, and the processed resist film was used as an etching mask to form a mask pattern. The resist film was then stripped off, giving in each case a photomask with a line-and-space pattern that provides a 0.1 µm linewidth on wafers during exposure and that had a pattern coverage (percent covered by chromium) in the principal surface region of the substrate of 94%. When the resulting photomasks were vacuum chucked onto the mask stage in a wafer exposure system, 34 of the 50 photomasks had an acceptable flatness.

Japanese Patent Application No. 2003-280463 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of selecting photomask blank substrates which are quadrangular and have a length on each side of at least 6 inches, provided that a pair of strip-like regions extend from 2 mm to 10 mm inside each of a pair of opposing sides along an outer periphery of a top surface of a substrate on which a mask pattern is to be formed, with a 2 mm edge portion excluded at each end in a lengthwise direction thereof, the method comprising the steps of:

measuring the height from a least squares plane for the strip-like regions on the substrate top surface to the strip-like regions at intervals of 0.05 to 0.35 mm in horizontal and vertical directions, and selecting, as a substrate having an acceptable surface shape, a substrate in which the difference between the maximum and minimum values for the height among all the measurement points is not more than 0.5 µm.

2. A method of selecting photomask blank substrates which are quadrangular and have a length on each side of at least 6 inches, provided that a quadrangular ring-shaped region extends from 2 mm to 10 mm within each side along an outer periphery on a top surface of a substrate on which a mask pattern is to be formed, the method comprising the steps of:

measuring the height from a least squares plane for the quadrangular ring-shaped region on the substrate top surface to the quadrangular ring-shaped region at intervals of 0.05 to 0.35 mm in horizontal and vertical directions, and selecting, as a substrate having an acceptable surface shape, a substrate in which the difference between the maximum and minimum values for the height among all the measurement points is not more than 0.5 µm.

* * * * *